United States Patent
Fan et al.

(10) Patent No.: US 9,337,217 B2
(45) Date of Patent: May 10, 2016

(54) DISPLAY DEVICE WITH BARRIER LAYER DISPOSED AT PRE-CUTTING POSITION AND MANUFACTURING METHOD THEREOF

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Yuguang Fan, Beijing (CN); Zhenwei Wang, Beijing (CN); Weixin Meng, Beijing (CN); Jian Li, Beijing (CN); Jingpeng Li, Beijing (CN); Sunghun Song, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/561,422

(22) Filed: Dec. 5, 2014

(65) Prior Publication Data
US 2016/0056183 A1 Feb. 25, 2016

(30) Foreign Application Priority Data
Aug. 20, 2014 (CN) .......................... 2014 1 0412413

(51) Int. Cl.
*H01L 27/15* (2006.01)
*G02F 1/1335* (2006.01)
*H01L 27/12* (2006.01)
*G02F 1/1333* (2006.01)

(52) U.S. Cl.
CPC ...... *H01L 27/1248* (2013.01); *G02F 1/133351* (2013.01); *H01L 27/1259* (2013.01); *H01L 27/156* (2013.01); *G02F 1/1335* (2013.01)

(58) Field of Classification Search
CPC .............. H01L 51/56; H01L 2251/566; H01L 51/5237
USPC ........................................................ 313/512
See application file for complete search history.

(56) References Cited

U.S. PATENT DOCUMENTS

2013/0335686 A1* 12/2013 Chen ..................... G02F 1/1335
349/106

* cited by examiner

*Primary Examiner* — Evan Pert
*Assistant Examiner* — Changhyun Yi
(74) *Attorney, Agent, or Firm* — Ladas & Parry LLP

(57) ABSTRACT

A display device and a manufacturing method thereof are provided, and the display device includes an array substrate, an opposite substrate and sealant frames between the array substrate and the opposite substrate, with a pre-cutting position disposed between two adjacent the sealant frames. The display device further includes a barrier layer between the array substrate and the opposite substrate and at a position corresponding to the above-mentioned pre-cutting position, and a material forming the barrier layer has an elongation at fracture smaller than that of a material forming the sealant frames. The display device can solve the problem of a large quantity of burrs caused by the sealant frames during the cutting process of a display screen under the precondition of reducing production costs.

18 Claims, 7 Drawing Sheets

DISPLAY DEVICE WITH BARRIER LAYER DISPOSED AT PRE-CUTTING POSITION AND MANUFACTURING METHOD THEREOF

TECHNICAL FIELD

At least one embodiment of the present disclosure relates to a display device and a manufacturing method thereof.

BACKGROUND

As a kind of flat panel display devices, TFT-LCDs (Thin Film Transistor Liquid Crystal Displays) are more and more applied in high performance display field due to their features of small volume, low power consumption, no irradiation, relatively low manufacturing costs, and so on.

SUMMARY

In one aspect of embodiments of the present disclosure, a display device is provided, and the display device includes an array substrate, an opposite substrate, sealant frames between the array substrate and the opposite substrate, and a barrier layer. A pre-cutting position is disposed between two adjacent the sealant frames, and the barrier layer is located between the array substrate and the opposite substrate and at a position corresponding to the pre-cutting position. A material forming the barrier layer has an elongation at fracture smaller than that of a material forming the sealant frames.

In another aspect of embodiments of the present disclosure, a manufacturing method of a display device is provided, and the method includes: manufacturing an array substrate and an opposite substrate respectively with a pre-cutting position disposed on the array substrate or the opposite substrate; forming a barrier layer at a position corresponding to the pre-cutting position; forming sealant frames on a surface of the array substrate or the opposite substrate, with the barrier layer provided between two adjacent the sealant frames; and assembling the opposite substrate and the array substrate to form a cell. In the method, the material forming the barrier layer has an elongation at fracture smaller than that of a material forming the sealant frames.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 2b is a sectional view taken along A-A' in FIG. 2a;

REFERENCE NUMERALS

01—Effective display area of display panel; 10—Array substrate; 100—Second base substrate; 101—Gate electrode; 102—Gate insulating layer; 103—Active layer; 104—Source/drain metal layer; 105—Pixel electrode; 106—Passivation layer; 107—Common electrode; 11—Color filter substrate; 110—First base substrate; 111—Black matrix; 112—Color filter layer; 113—Protection layer; 114—Spacer; 12—Sealant frame; 20—Barrier layer; 201—First sub-barrier layer; 202—Second sub-barrier layer; 203—Interlocking structure; 210—Resin layer; 211—Photoresist; A—Photoresist retention area; B—Photoresist removal area; C—Photoresist complete retention area; D—Photoresist partial retention area; E—Photoresist complete removal area.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the present disclosure.

Figure 1A:
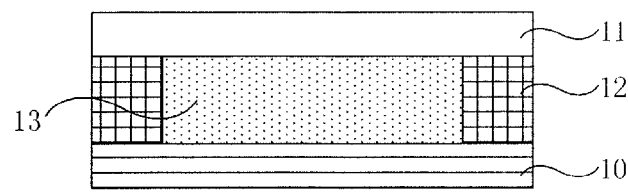
FIG. 1a is a schematic structure view of a display panel.

As shown in FIG. 1a, for example, a TFT-LCD includes an array substrate 10 and a color filter substrate 11, with its manufacturing process as described below, for example. Firstly, sealant frames 12 arranged in a matrix are formed on a surface of a large piece of array substrate 10. Then liquid crystal 13 is instilled inside the sealant frames 12. Finally the above-mentioned large piece of array substrate 10 and a large piece of color filter substrate 11 are disposed oppositely to form a cell such that the sealant frames 12 can seal the liquid crystal 12 instilled between the array substrate 10 and the color filter substrate 11. A large piece of display screen is formed by the above-mentioned process, and afterwards the large piece of display screen still needs to be cut into small display screens of preset size.

Figure 1B:
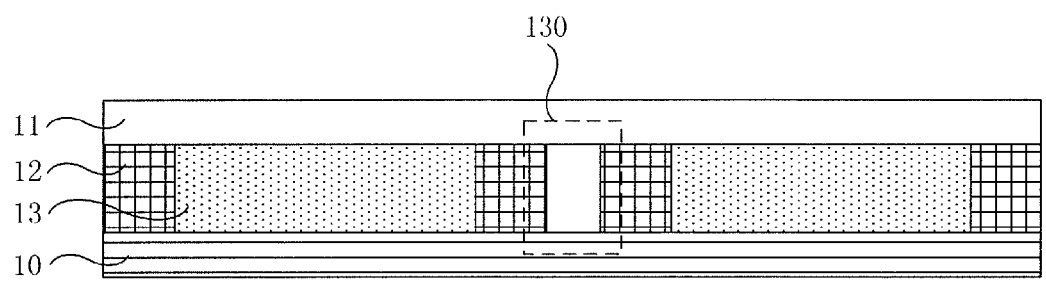
FIG. 1b is a schematic structure view of a display panel before a cutting process.

In the cutting process for a display screen, as shown in FIG. 1b, a certain gap 130 is provided between two adjacent sealant frames 12, in which the cutting is implemented. This can avoid damage to the liquid crystal cell by the cutting process. However, the presence of the above-mentioned gap 130 may result in large bezels of the display screens, and thereby fail to meet the narrow bezel trend in the display field.

Figure 1C:
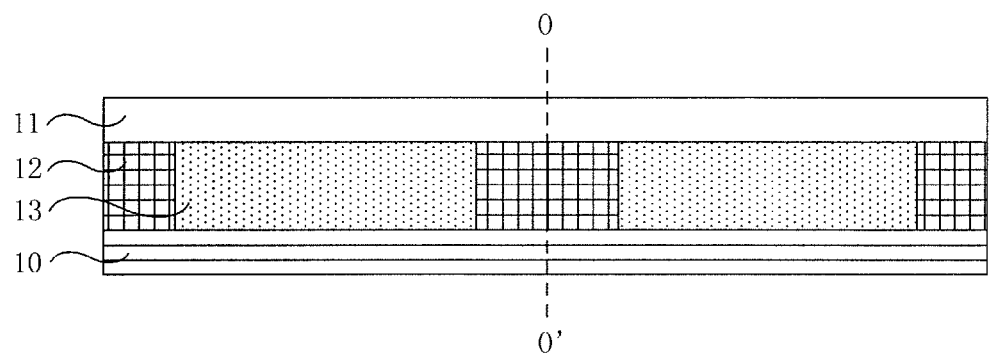
FIG. 1c is a schematic structure view of another display panel before a cutting process.

In order to solve the above problem, as shown in FIG. 1c, the gap 130 between two adjacent sealant frames 12 may be removed, and by using a cutting process for sealant which is a laser cutting technology for example, the sealant frames 12 at a preset cutting position (O-O') are cut. Though the laser cutting technology has advantages of high energy density, fast cutting speed, high cutting precision, and so on, it can increase production costs greatly. A sealant frame 12 is generally formed of acrylic acid and epoxy resin. Since the epoxy resin has a large tackiness or elongation at fracture at high temperature, if the laser technology is not applied in the cutting process for sealant so as to reduce the production costs, the high temperature generated during cutting can increase the elongation at fracture of the sealant frame 12. Since common cutting technologies have a slower speed with respect to the laser cutting, the sealant frame 12 tends to adhere to the transparent substrate of the display screen during cutting, and thus a large quantity of burrs are generated, which can adversely affect subsequent display screen driving bonding process and backlight assembling process, and reduce the yield of the products.

Figure 2A:
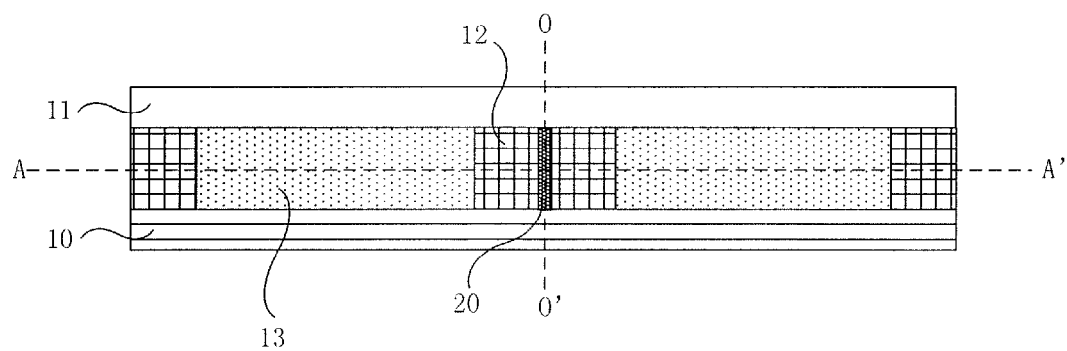
FIG. 2a is a schematic structure view of a display panel provided in an embodiment of the present disclosure before a cutting process.

At least one embodiment of the present disclosure provides a display device. As shown in FIG. 2a, the display device may include an array substrate 10, an opposite substrate 11 and sealant frames 12 between the array substrate 10 and the opposite substrate 11, with a pre-cutting position (O-O') disposed between two adjacent the sealant frames 12. The display device may further include a barrier layer 20 between the array substrate 10 and the opposite substrate 11 and at a position corresponding to the pre-cutting position (O-O'). A material forming the above-mentioned barrier layer 20 has an elongation at fracture less than that of a material forming the sealant frames 12. The opposite substrate may be a color filter substrate or a transparent substrate. In the following embodiments, the opposite substrate is described as a color filter substrate as an example.

Figure 2B:
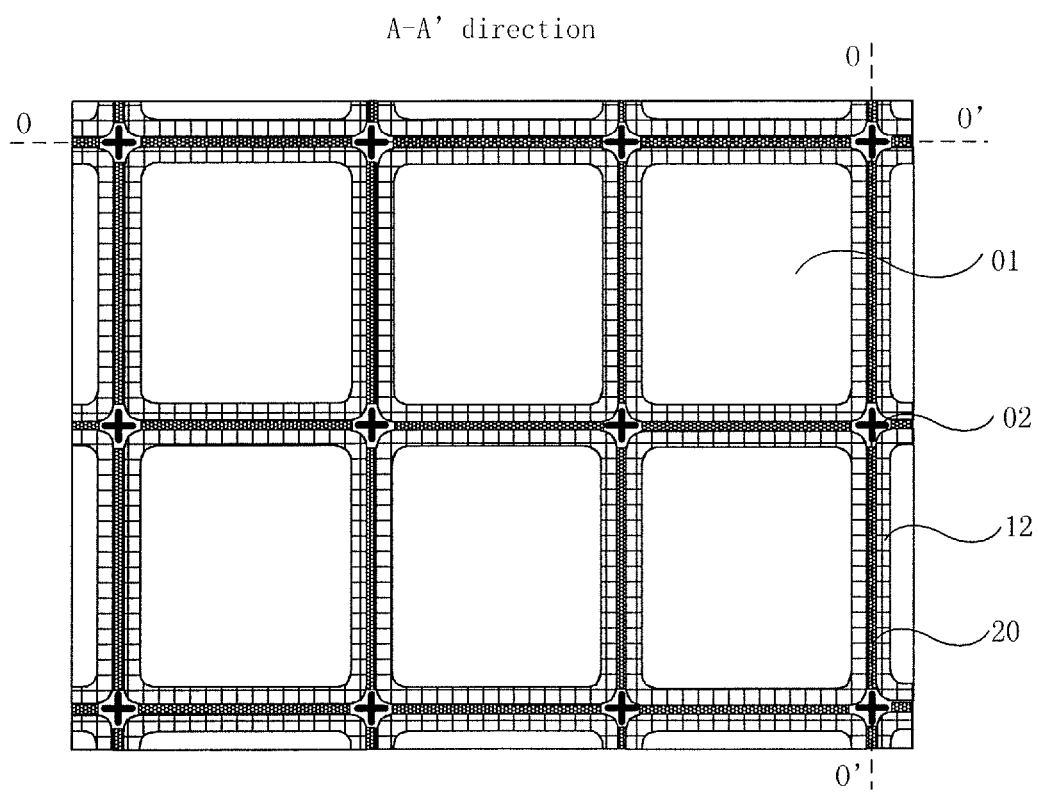

It is to be noted that the elongation at fracture refers to the percentage of the maximum extension length of a material under stretching to the original length. The smaller the elongation at fracture of a material, the more likely to break during a cutting process; otherwise, the more difficult to break. As shown in FIG. 2b, alignment marks 02 are disposed on the periphery of the effective display area 01 of each display panel. The above-mentioned pre-cutting position (O-O') may be arranged according to an above-mentioned alignment mark 02. The barrier layer 20 provided in embodiments of the present disclosure is located at the pre-cutting position (O-O') such that the sealant frames 12 cannot be damaged during the cutting process, and the barrier layer 20 that is easily broken are cut directly.

Embodiments of the present disclosure provide a display device including an array substrate, a color filter substrate and sealant frames between the array substrate and the color filter substrate, with a pre-cutting position disposed between two adjacent the sealant frames. Furthermore, the display device further includes a barrier layer between the array substrate and the color filter substrate and at a position corresponding to the above-mentioned pre-cutting position, and an elongation at fracture of a material forming the barrier layer is smaller than that of a material forming the sealant frames. Since the sealant frames can seal the liquid crystal instilled between the array substrate and the color filter substrate, a material with a certain tackiness is generally used to form the sealant frames. A material with a larger tackiness has a larger elongation at fracture and is not easy to break during a cutting process.

However, in cases shown in FIGS. 1a to 1c, for a slow cutting speed, a portion of a sealant frame at a cut can be pulled and adhere to the transparent substrate of the display screen, hence generating a large quantity of burrs. While in embodiments of the present disclosure, a common cutting process may be used to cut the barrier layer along the pre-cutting position, so as to cut the display panel. The cutting speed of the common cutting process is slow, but since the barrier layer is easy to break with respect to the sealant frames due to the smaller elongation at fracture, it is possible to prevent the material at the cut from adhering to the transparent substrate of the display screen, hence avoiding the occurrence of burrs. At the same time, the embodiments of the present disclosure are applicable to a common cutting process and therefore can reduce the production costs.

Figure 3:
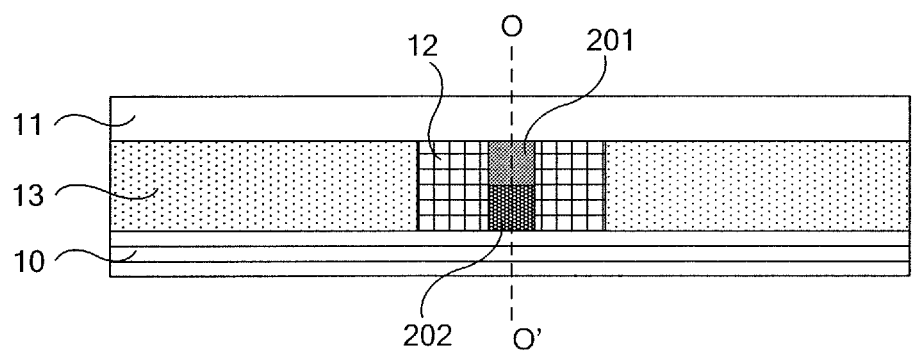
FIG. 3 is a schematic structure view of another display panel provided in an embodiment of the present disclosure before a cutting process.

It is to be noted that the above-mentioned barrier layer 20 may be disposed on the array substrate 10 or the barrier layer 20 may be disposed on the color filter substrate 11. Alternatively, as shown in FIG. 3, a first sub-barrier layer 201 is disposed on the color filter substrate 11, and a second sub-barrier layer 202 is disposed on the array substrate 10. The first sub-barrier layer 201 and the second sub-barrier layer 202 form the above-mentioned barrier layer 20.

In order to realize a narrow-bezel design, the barrier layer 20 (or the first sub-barrier layer 201 and the second sub-barrier layer 202) may have a width from 0.1 μm to 200 μm, for example. Because when the width is too small, the sealant frames 12 may be damaged during the cutting process; while when the width is too large, the narrow-bezel design requirement can not be satisfied.

Furthermore, under the precondition of ensuring that the elongation at fracture of the material forming the above-mentioned barrier layer 20 is smaller than that of the material forming the sealant frames 12, in order to further improve the sealing performance of the liquid crystal cell, materials with certain elasticity such as resin materials may be used to form the barrier layer 20 (or the first sub-barrier layer 201 and the second sub-barrier layer 202). Also, in at least one embodiment, the height of the barrier layer 20, or the sum of heights of the first sub-barrier layer 201 and the second sub-barrier layer 202 may be 1~1.2 times as large as the cell gap of the display device. Thus, after assembling the array substrate 10 and the color filter substrate 11 to form a cell, the barrier layer 20 (or the first sub-barrier layer 201 and the second sub-barrier layer 202) is pressed such that top and bottom surfaces of the barrier layer 20 (or the top surface of the first sub-barrier layer 201, and the bottom surface of the second sub-barrier layer 202) make close contact with the color filter substrate 11 and the array substrate 10 respectively, thereby improving the sealing performance of the liquid crystal cell.

Figure 4:
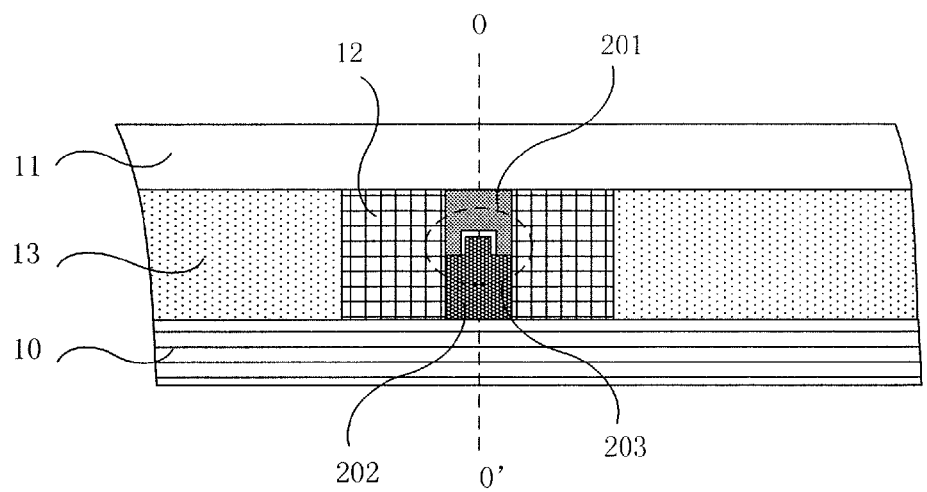
FIG. 4 is a schematic structure view of yet another display panel provided in an embodiment of the present disclosure before a cutting process.

In at least one embodiment, as shown in FIG. 4, an interlocking structure 203 may be further disposed between the first sub-barrier layer 201 and the second sub-barrier layer 202. For example, the interlocking structure 203 may include a groove and a bump that matches the groove in terms of size and shape, and the groove and the bump are disposed on two surfaces of the first sub-barrier layer 201 and the second sub-barrier layer 202 respectively. The shapes of the groove and the bump in embodiments of the present disclosure are not limited. The above-mentioned interlocking structure 203 can improve the sealing performance of contact surfaces of the first sub-barrier layer 201 and the second sub-barrier layer 202.

Specific arrangement of the barrier layer 20 (or the first sub-barrier layer 201 and the second sub-barrier layer 202) will be illustrated by specific embodiments below.

Embodiment I

The barrier layer 20 or the first sub-barrier layer 201 may be disposed on the color filter substrate 11.

Figure 5:
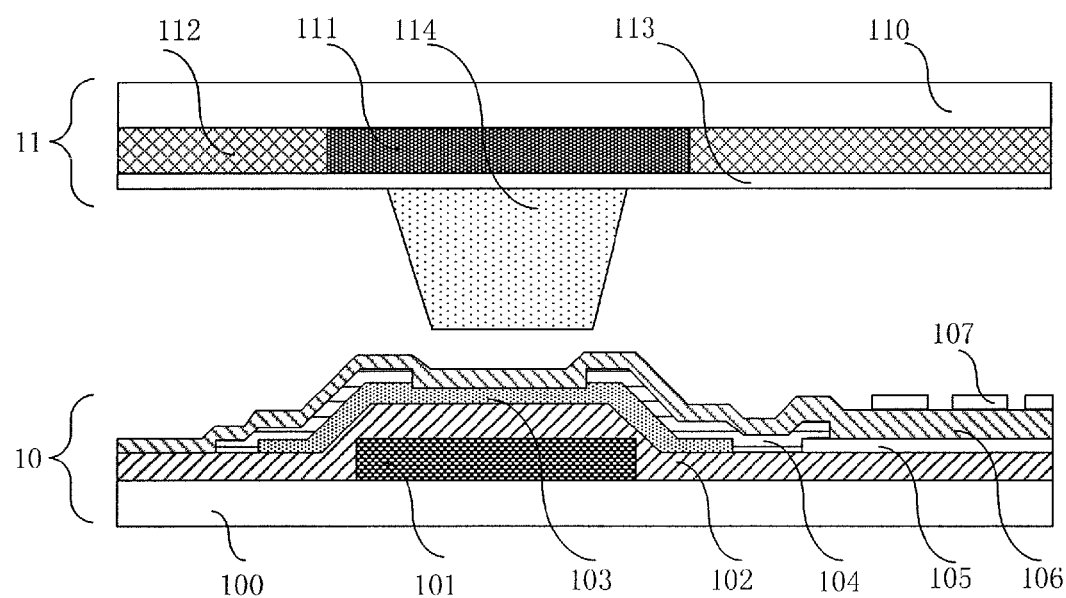
FIG. 5 is a schematic structure view of a display device provided in an embodiment of the present disclosure.

Taking the display device shown in FIG. 5 as an example, the color filter substrate 11 may include a first base substrate 110, and a black matrix 111, a color filter layer 112, a protection layer 113 and a spacer 114 that are sequentially disposed on a surface of the first base substrate 110 at a side close to the array substrate 10.

The black matrix 111, the color filter layer 112, the protection layer 113 and the spacer 114 can all be formed of resin materials. And the above-mentioned layer structures need not have the sealing effect of the sealant frames 12. Therefore, the resin materials forming respective layer structures on the color filter substrate 11 have smaller elongation at fracture than the material of the sealant frames 12 and are easy to break in the cutting process. Therefore in the process of manufacturing the color filter substrate 11, the barrier layer 20 may be formed at the same time as the black matrix 111, the color filter layer 112, the protection layer 113 or the spacer 114 is formed by one patterning process so as to simplify the manufacturing process.

It is to be noted that in embodiments of the present disclosure, the patterning process may include a photolithographic process or a photolithographic process and an etching step while may further include at the same time other processes used for forming predetermined patterns such as printing and ink jetting processes. The photolithographic process refers to the process that includes film formation, exposure, development, and the like, and that is used for forming patterns by using photoresist, mask, and exposure machine, and so on. Respective patterning process may be selected according to the structure to be formed in embodiments of the present disclosure. The one patterning process in embodiments of the present disclosure is explained with respect to the example of forming different exposure regions by one masking and exposing process, and then subjecting the different exposure regions to removal processes such as etching and asking for a plurality of times to finally obtain the intended patterns.

In at least one example, the barrier layer 20 and a thin film layer (for example, the spacer 114 or the protection layer 113) on the surface of the color filter substrate 11 on the side away from the first base substrate 110 are disposed in the same layer and made of the same material. Thus, it is possible to prevent the barrier layer 20 from adversely affecting the thin film layer on the color filter substrate 11. Furthermore, it is beneficial for controlling the height of the barrier layer 20. For example, the height of barrier layer 20 may be 1~1.2 times as large as the cell gap of the display device as stated above. The cell gap may be the thickness of the liquid crystal layer filled in between the color filter substrate 11 and the array substrate 10. When the barrier layer 20 is disposed in the same layer and made of the same material as the color filter layer 112, the protection layer 113 formed on the surface of the color filter layer 112 thereafter covers the surface of the barrier layer 20, thereby increasing the height of the barrier layer 20, and causing the color filter substrate 11 and the array substrate impossible to be assembled to form the cell. Therefore, it is necessary to further remove the thin film layer formed thereafter corresponding to the barrier layer 20 during manufacturing the barrier layer 20, which can increase the complexity of the manufacturing process and make against the increase of production efficiency.

It is to be noted that the present embodiment is described with respect to the example in which the spacer is disposed on the color filter substrate, however, the spacer may also be disposed on the array substrate.

Embodiment II

Hereinafter, the manufacturing process of disposing the barrier layer 20 on the color filter substrate 11 will be described in detail with respect to an example in which the barrier layer 20 and the spacer 114 are disposed in the same layer and made of the same material.

Figure 6A:
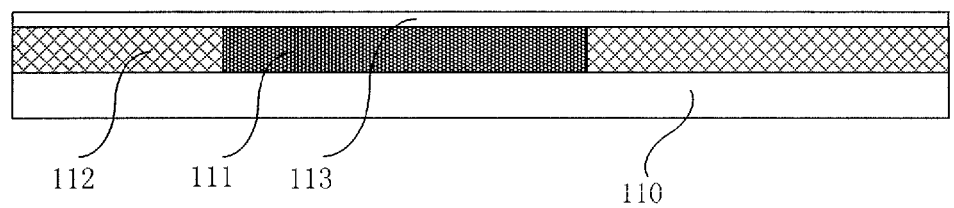
FIGS. 6a-6d are schematic structure views illustrating a manufacturing process of a barrier layer provided in an embodiment of the present disclosure.
Figure 6B:
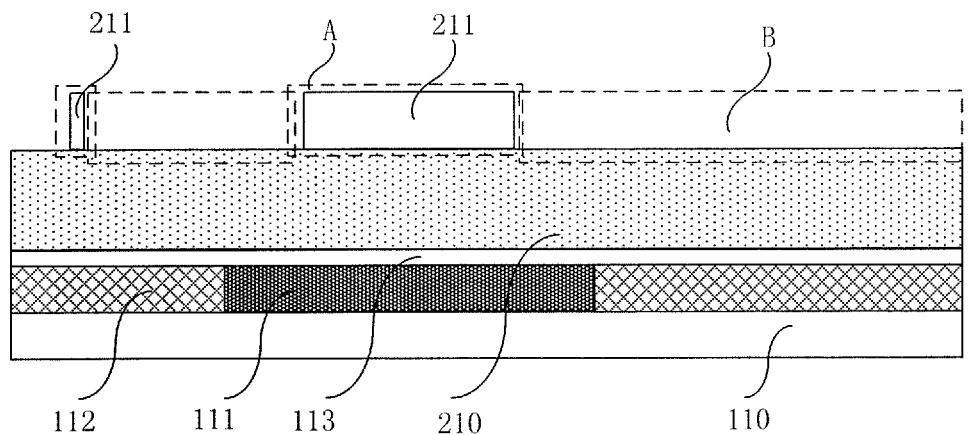
Figure 6C:
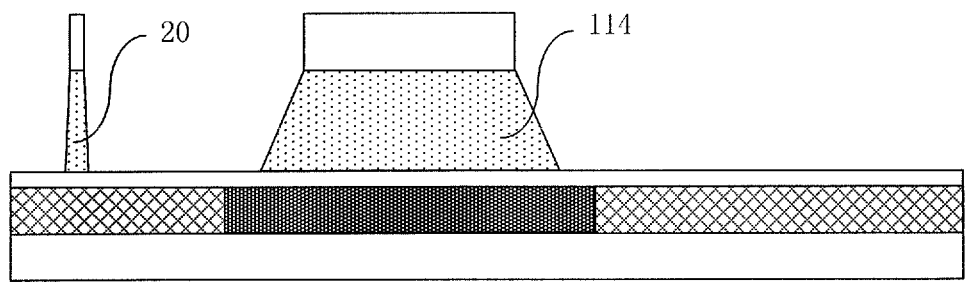

Firstly, as shown in FIG. 6a, a black matrix 111, a color filter layer 112 and a protection layer 113 are sequentially formed on a surface of a first base substrate 110 by patterning process. Then, a resin layer 210 is coated on the surface of the substrate having the above-mentioned structures formed thereon, with a thickness same as the preset thickness of the spacer 114. Next, as shown in FIG. 6b, a photoresist 211 is coated on a surface of the resin layer 210, and by a masking and exposing process, a photoresist retention area A corresponding to the positions of the spacer 114 and the barrier layer 20 and a photoresist removal area B corresponding to the rest areas of the surface of the resin layer 210 are formed. Finally, the resin layer 210 in the photoresist removal area B is etched, as shown in FIG. 6c, and then the photoresist in the photoresist retention area is lifted off to finally form the spacer 114 and the barrier layer 20 shown in FIG. 6d.

Embodiment III

Hereinafter, the manufacturing process of disposing the first sub-barrier layer 201 on the color filter substrate 11 will be described in detail with respect to an example in which the first sub-barrier layer 201 and the spacer 114 are disposed in the same layer and made of the same material. Since the sum of heights of the first sub-barrier layer 201 and the second sub-barrier layer 202 is 1 to 1.2 times as large as the cell gap of the liquid crystal cell, the height of the first sub-barrier layer 201 is smaller than that of the spacer 114, therefore the masking and exposing process needs to be carried out with a dual-tone mask to form a thin film layer with height difference.

Firstly, as shown in FIG. 6a, a black matrix 111, a color filter layer 112 and a protection layer 113 are sequentially formed on a surface of the first base substrate 110 by patterning process. Then, a resin layer 210 is coated on the surface of the substrate having the above-mentioned structure formed thereon, with a thickness same as the preset thickness of the spacer 114. Next, as shown in FIG. 6e, a photoresist 211 is coated on a surface of the resin layer 210, a masking and exposing process is performed by a dual-tone mask, and thus a photoresist complete retention area C corresponding to the position of the spacer 114, a photoresist partial retention area D corresponding to the position of the first sub-barrier layer 201 and a photoresist complete removal area E corresponding to the rest areas of the surface of the resin layer 210 are formed. Subsequently, as shown in FIG. 6f, the resin layer 210 in the photoresist complete removal area E is partially etched. As shown in FIG. 6g, then the photoresist in the photoresist partial retention area D is ashed by an ashing process and the resin layer 210 in the photoresist partial retention area D is etched, and at the same time the resin layer 210 in the photoresist complete removal area E is etched, to form the pattern of the first sub-barrier layer 201. Finally, as shown in FIG. 6h, the photoresist in the photoresist complete retention area C is lifted off to form the spacer 114.

It is to be noted that in embodiments of the present disclosure, the dual-tone mask is a semi-transparent mask that can form photoresists of two different thicknesses (photoresist in the photoresist complete retention area C and photoresist in the photoresist partial retention area D) on a surface of the resin layer 210. Dual-tone masks may include gray-tone masks and half-tone masks.

Embodiment IV

The barrier layer 20 or the second sub-barrier layer 202 may be disposed on the array substrate 10.

Taking the display device shown in FIG. 5 as an example, the array substrate 10 includes a TFT gate electrode 101, a gate insulating layer 102, an active layer 103, a source/drain metal layer 104, a pixel electrode 105, a passivation layer 106 and a common electrode 107 that are located sequentially on a surface of the second base substrate 100.

The above-mentioned gate insulating layer 102 with insulating function and the passivation layer 106 both have an elongation at fracture smaller than that of the sealant frames 12, so it is possible to form the barrier layer 20 (or the second sub-barrier layer 202) at the same time as the gate insulating layer 102 or the passivation layer 106 is formed by a patterning process, so as to simplify the manufacturing process. However, the gate insulating layer 102 is generally formed of silicon dioxide that has a complex and expensive film formation process with respect to the passivation layer 106 that is formed of a resin material. And that the barrier layer 20 (or the second sub-barrier layer 202) and the gate insulating layer 102 disposed in the same layer and made of the same material can affect the source/drain metal layer 104, the pixel electrode 105 and the common electrode 107 that are manufactured in subsequent processes. For example, it is easy for the common electrode 107 to be caused to have level difference and disconnection.

Therefore, in one example, it is possible to make the barrier layer 20 or the second sub-barrier layer 202 and the passivation layer 106 disposed in the same layer and made of the same material. The above-mentioned embodiment III may be referred to for the specific manufacturing method.

It is to be noted that all the above-mentioned embodiments are explained with respect to the example of the IPS (in plane switch) display device shown in FIG. 5. The embodiments of the present disclosure do not limit the kind of the TFT-LCD. For example, it is possible to use a TN (twist nematic) display device in which common electrodes are disposed on the color filter substrate 11. It is also possible to use an ADS (advanced-super dimensional switching) display device in which common electrodes and pixel electrodes are disposed in different layers on the array substrate 10, in the display device, pixel electrodes in an upper layer may be slit-like and common electrodes in a bottom layer may be planar.

Figure 7:
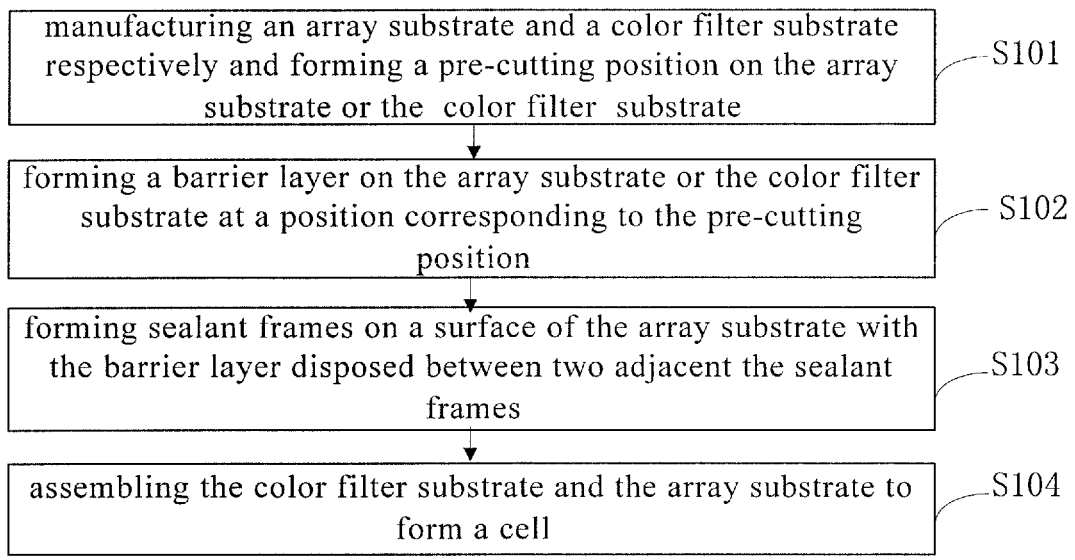
FIG. 7 is a manufacturing flow chart of a display device provided in an embodiment of the present disclosure.

At least one embodiment of the present disclosure provides a manufacturing method of a display device, and as shown in FIG. 7, the method may include the following steps S101 to S104.

In S101, as shown in FIG. 2a, an array substrate 10 and a color filter substrate 11 are manufactured respectively. a pre-cutting position (O-O') is disposed on the array substrate 10 or the color filter substrate 11.

In S102, a barrier layer 20 is formed at a position corresponding to the pre-cutting position (O-O'). For example, the barrier layer may be formed on the array substrate or the color filter substrate.

In step S103, sealant frames 12 are formed on a surface of the array substrate 10 or the color filter substrate 11. The barrier layer 20 is provided between two adjacent the sealant frames 12.

In S104, the color filter substrate 11 and the array substrate 10 are assembled to form a cell.

In the above-mentioned method, a material forming the above-mentioned barrier layer 20 has an elongation at fracture smaller than that of a material forming the sealant frames 12.

It is to be noted that the smaller the elongation at fracture of a material, the more likely to break during a cutting process; otherwise, the more difficulty to break. As shown in FIG. 2b, alignment marks 02 are disposed on a periphery of the effective display area 01 of each display panel. The pre-cutting position (O-O') may be arranged according to an above-mentioned alignment mark 02. The barrier layer 20 provided in embodiments of the present disclosure is located at the pre-cutting position (O-O') such that the sealant frames 12 can not be damaged during the cutting process, and the barrier layer 20 that is easily broken is cut directly.

A manufacturing method of a display device provided in an embodiment of the present disclosure includes: firstly manufacturing an array substrate and a color filter substrate respectively and forming a pre-cutting position on the array substrate or the color filter substrate; then, forming a barrier layer at a position corresponding to the pre-cutting position; next, forming sealant frames on a surface of the array substrate or the color filter substrate with the barrier layer disposed between two adjacent the sealant frames; and finally, assembling the color filter substrate and the array substrate to form a cell. In the method, a material forming the barrier layer has an elongation at fracture smaller than that of a material forming the sealant frames. Since the sealant frames can seal the liquid crystal instilled between the array substrate and the color filter substrate, the sealant frames are generally formed of a material with a certain tackiness. The material with a larger tackiness has a larger elongation at fracture. Therefore, the sealant frames are not easy to break during a cutting process. However, in cases shown in FIGS. 1a to 1c, when a cutting speed is slow, a portion of the sealant frames at a cut can be pulled and adhere to the transparent substrate of the display screen, hence generating a large quantity of burrs. While in embodiments of the present disclosure, a common cutting process may be used to cut the barrier layer along the pre-cutting position, so as to cut the display panel. Notwithstanding the slow speed of the common cutting process, since the barrier layer is easy to break with respect to the sealant frames due to the smaller elongation at fracture, it is possible to prevent the material at the cut from adhering to the transparent substrate of the display screen, hence avoiding the occurrence of burrs. At the same time, the embodiments of the present disclosure are applicable to a common cutting process and therefore can reduce the production costs.

Figure 8:
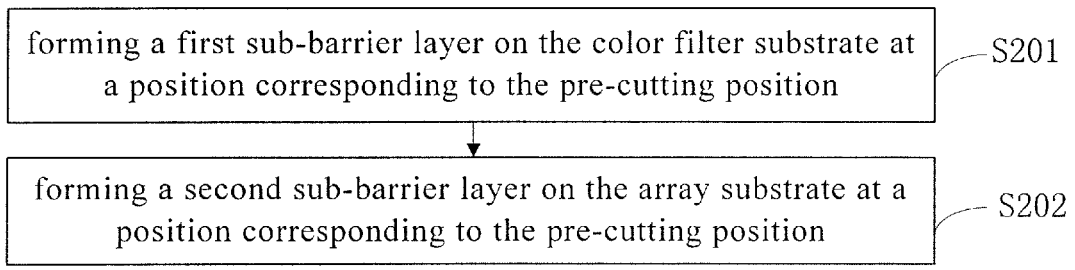
FIG. 8 is a manufacturing flow chart of a barrier layer provided in an embodiment of the present disclosure.

It is to be noted that the above-mentioned step S102, as shown in FIG. 8, may include, for example, step S201 and step S202.

In S201, a first sub-barrier layer 201 is formed at a position corresponding to the pre-cutting position (O-O') on the color filter substrate 12.

In S202, a second sub-barrier layer 202 is formed at a position corresponding to the pre-cutting position (O-O') on the array substrate 11.

After the color filter substrate 12 and the array substrate 11 are assembled to form the cell, the above-mentioned first sub-barrier layer 201 and the second sub-barrier layer 202 form the barrier layer 20. It is to be noted that the embodiment of the present disclosure does not limit the order of step S201 and step S202.

In order to realize the narrow-bezel design, the barrier layer 20 (or the first sub-barrier layer 201 and the second sub-barrier layer 202) may have a width of for example, 0.1~200 µm. Because when the width is too small, the sealant frames 12 may be damaged during a cutting process; while when the width is too large, the narrow-bezel design requirement can not be satisfied.

Furthermore, under the precondition of ensuring that the elongation at fracture of the material forming the above-mentioned barrier layer 20 is smaller than that of the material forming the sealant frames 12, in order to further improve the sealing performance of the liquid crystal cell, some materials with certain elasticity such as resin materials may be used to form the barrier layer 20 (or the first sub-barrier layer 201 and the second sub-barrier layer 202). Also, in at least one embodiment, the height of the barrier layer 20, or the sum of heights of the first sub-barrier layer 201 and the second sub-barrier layer 202 may be 1~1.2 times as large as the cell gap of the display device. Thus, after assembling the array substrate 10 and the color filter substrate 11 to form a cell, the barrier layer 20 (or the first sub-barrier layer 201 and the second sub-barrier layer 202) is pressed such that top and bottom surfaces of the barrier layer 20 (or the top surface of first sub-barrier layer 201, and the bottom surface of the second sub-barrier layer 202) make close contact with the color filter substrate 11 and the array substrate 10 respectively, thereby improving the sealing performance of the liquid crystal cell.

Specific manufacturing process of the barrier layer 20 (or the first sub-barrier layer 201 and the second sub-barrier layer 202) will be illustrated by specific embodiments below.

Embodiment V

The barrier layer 20 or the first sub-barrier layer 201 may be disposed on the color filter substrate 11.

Taking the display device shown in FIG. 5 as an example, the color filter substrate 11 may include a first base substrate 110, and a black matrix 111, a color filter layer 112, a protection layer 113 and a spacer 114 that are sequentially located on a surface of the first base substrate 110 at a side that is close to the array substrate 10.

The black matrix 111, the color filter layer 112, the protection layer 113 and the spacer 114 can all be formed of resin materials. And the above-mentioned layer structures need not have the sealing effect of the sealant frames 12. Therefore, resin materials forming respective layer structures on the color filter substrate 11 have a smaller elongation at fracture than the material forming the sealant frames 12 and are easy to break in a cutting process. Therefore in the process of manufacturing the color filter substrate 11, the barrier layer 20 may be formed at the same time as the black matrix 111, the color filter layer 112, the protection layer 113 or the spacer 114 is formed by a patterning process so as to simplify the manufacturing process.

In at least one example, by a patterning process, the barrier layer 20 or the first sub-barrier layer 201 disposed in the same layer and made of the same material as a thin film layer (for example, the spacer 114 or the protection layer 113) on the surface of the color filter substrate 11 on the side away from the first base substrate 110 may be formed. Thus, it is possible to prevent the barrier layer 20 from adversely affecting the thin film layer on the color filter substrate 11. Furthermore, it is beneficial for controlling the height of the barrier layer 20. For example, the height of barrier layer 20 is 1~1.2 times as large as the cell gap of the display device as stated above. When the barrier layer 20 is disposed in the same layer and made of the same material as the color filter layer 112, the protection layer 113 formed on the surface of the color filter layer 112 thereafter can cover the surface of the barrier layer 20, thereby increasing the height of the barrier layer 20 and causing the color filter substrate 11 and the array substrate impossible to be assembled to form the cell. Therefore, it is necessary to further remove the thin film layer formed thereafter corresponding to the barrier layer 20 during manufacturing the barrier layer 20, which can increase the complexity of the manufacturing process and make against the increase of the production efficiency.

It is to be noted that the present embodiment is described with respect to the example in which the spacer is disposed on the color filter substrate, however, the spacer may be disposed on the array substrate.

Embodiment VI

Figure 9:
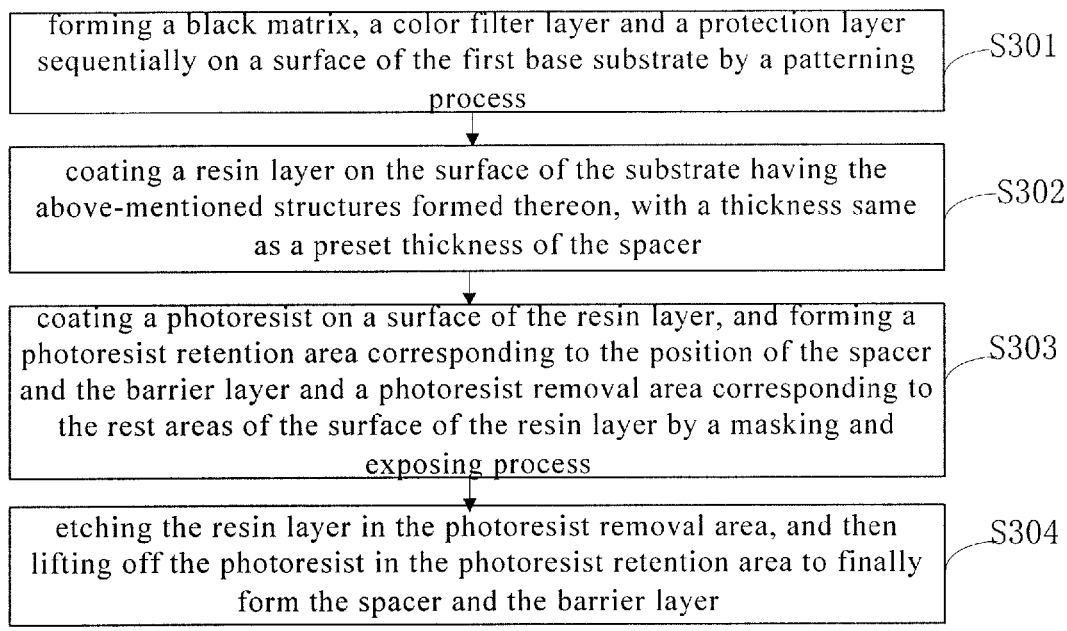
FIG. 9 is a manufacturing flow chart of another barrier layer provided in an embodiment of the present disclosure.

Hereinafter the manufacturing process of forming the barrier layer 20 disposed in the same layer and made of the same material as the spacer 114 by one patterning process is described in detail with specific steps shown in FIG. 9.

In S301, as shown in FIG. 6a, a black matrix 111, a color filter layer 112 and a protection layer 113 are sequentially formed on a surface of a first base substrate 110 by patterning processes.

In S302, a resin layer 210 is coated on the surface of the substrate having the above-mentioned structures formed thereon, with a thickness same as the preset thickness of the spacer 114.

In S303, as shown in FIG. 6b, a photoresist 211 is coated on a surface of the resin layer 210, and by a masking and exposing process, a photoresist retention area A corresponding to the position of the spacer 114 and the barrier layer 20 and a photoresist removal area B corresponding to the rest areas of the surface of the resin layer 210 are formed.

Figure 6D:
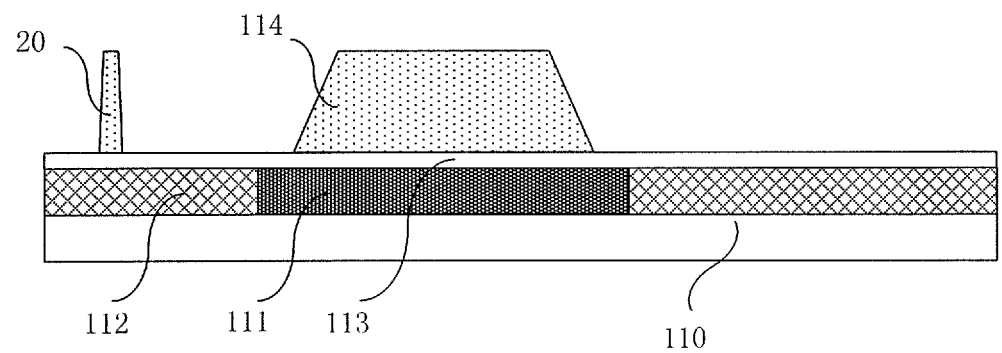
Figure 6E:
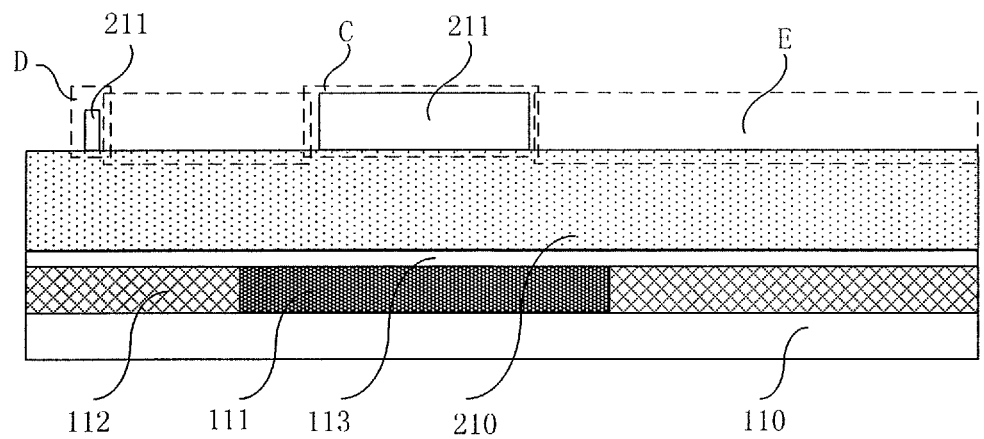
FIGS. 6e-6h are schematic structure views illustrating a manufacturing process of another barrier layer provided in an embodiment of the present disclosure.
Figure 6F:
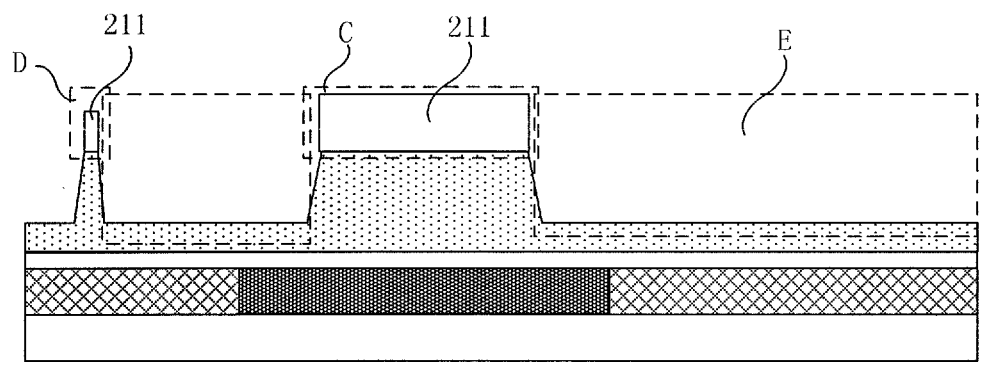
Figure 6G:
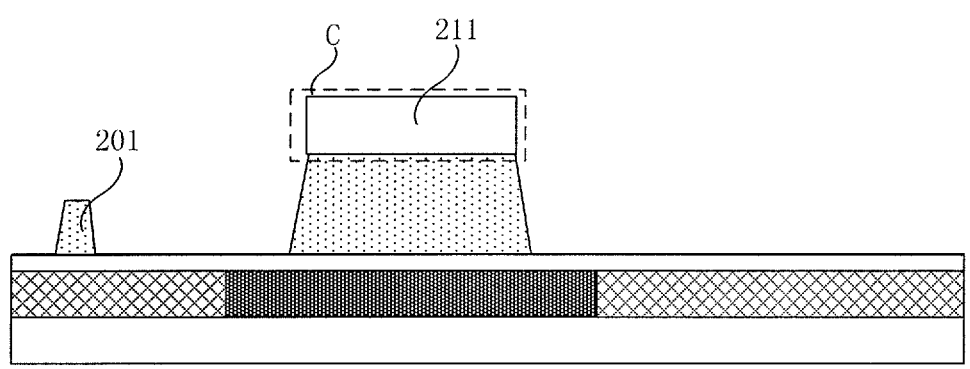
Figure 6H:
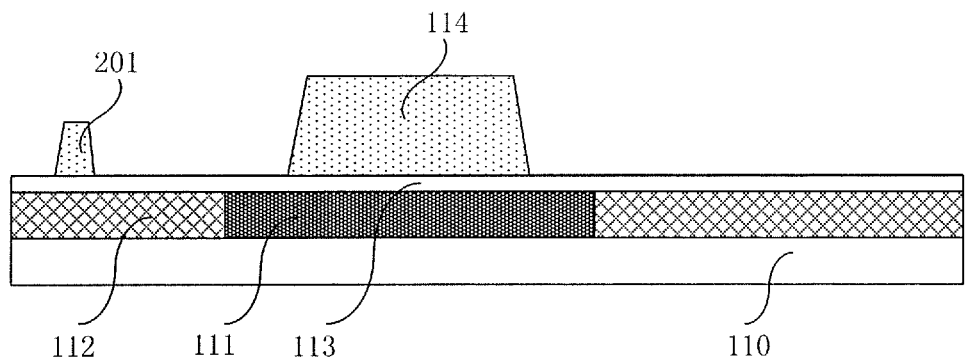

In S304, the resin layer 210 in the photoresist removal area B is etched, as shown in FIG. 6c, and then the photoresist in the photoresist retention area is lifted off to finally form the spacer 114 and the barrier layer 20 shown in FIG. 6d.

Embodiment VII

Figure 10:
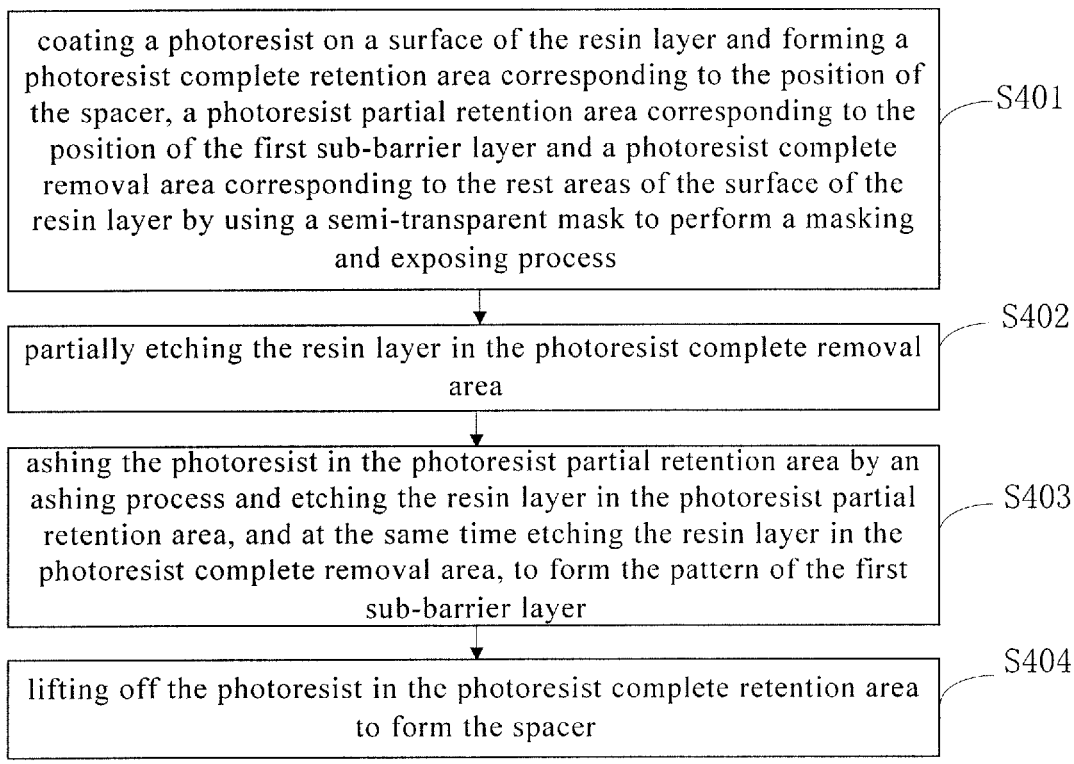
FIG. 10 is a manufacturing flow chart of yet another barrier layer provided in an embodiment of the present disclosure.

Hereinafter the manufacturing process of forming the first sub-barrier layer 201 disposed in the same layer and made of the same material as the spacer 114 by one patterning process is described in detail with specific steps shown in FIG. 10. Since the height of the first sub-barrier layer 201 is smaller than that of the spacer 114, a dual-tone mask is required for the masking and exposing process.

The method further includes the following step S401 to S 404, after completing the above-mentioned steps S301 and S302.

In S401, as shown in FIG. 6e, a photoresist 211 is coated on a surface of the resin layer 210 and a photoresist complete retention area C corresponding to the position of spacer 114, a photoresist partial retention area D corresponding to the position of the first sub-barrier layer 201 and a photoresist complete removal area E corresponding to the rest areas of the surface of the resin layer 210 are formed by a masking and exposing process with a dual-tone mask.

In S402, as shown in FIG. 6f, the resin layer 210 in the photoresist complete removal area E is partially etched.

In S403, as shown in FIG. 6g, the photoresist in the photoresist partial retention areas D is ashed by an ashing process and the resin layer 210 in the photoresist partial retention areas D is etched, and at the same time the resin layer 210 in the photoresist complete removal area E is etched, to form the pattern of the first sub-barrier layer 201.

In S404, as shown in FIG. 6h, the photoresist in the photoresist complete retention area C is lifted off to form the spacer 114.

Embodiment VIII

The barrier layer 20 or the second sub-barrier layer 202 may be disposed on the array substrate 10.

Taking the display device shown in FIG. 5 as an example, the array substrate 10 includes a TFT gate electrode 101, a gate insulating layer 102, an active layer 103, a source/drain metal layer 104, a pixel electrode 105, a passivation layer 106 and a common electrode 107 that are located sequentially on a surface of the second base substrate 100.

The above-mentioned gate insulating layer 102 with insulating function and the passivation layer 106 both have an elongation at fracture smaller than that of the sealant frames 12, therefore it is possible to form the barrier layer 20 (or the second sub-barrier layer 202) at the same time as the gate insulating layer 102 or the passivation layer 106 is formed by a patterning process, so as to simplify the manufacturing process. However, the gate insulating layer 102 is generally formed of silicon dioxide and has a complex and expensive film formation process with respect to the passivation layer 106 that is formed of a resin material. And that the barrier layer 20 (or the second sub-barrier layer 202) and the gate insulating layer 102 are disposed in the same layer and made of the same material can affect the source/drain metal layer 104, the pixel electrode 105 and the common electrode 107 manufactured subsequently. For example, it is easy for the common electrode 107 to be caused to have level difference and disconnection.

Therefore, in one example, it is possible to form the barrier layer 20 or the second sub-barrier layer 202 disposed in the same layer and made of the same material as the passivation layer 106 by one patterning process. The above-mentioned embodiment V may be referred to for the specific manufacturing method.

What are described above is related to the illustrative embodiments of the disclosure only and not limitative to the scope of the disclosure; the scopes of the disclosure are defined by the accompanying claims.

The present application claims priority of China patent application No. 201410412413.0 filed on Aug. 20, 2014, which is incorporated herein in its entirety by reference.

What is claimed is:

1. A display device comprising:
an array substrate;
an opposite substrate;
sealant frames between the array substrate and the opposite substrate, wherein a pre-cutting position is disposed between two adjacent the sealant frames; and
a barrier layer between the array substrate and the opposite substrate and at a position corresponding to the pre-cutting position,
wherein a material forming the barrier layer has an elongation at fracture smaller than that of a material forming the sealant frames, and the barrier layer comprises a first sub-barrier layer corresponding to the pre-cutting position and a second sub-barrier layer corresponding to the pre-cutting position, which are disposed on the opposite substrate and the array substrate respectively.

2. The display device of claim 1, wherein where a spacer is provided, the first sub-barrier layer is located in a same layer and made of a same material as the spacer.

3. The display device of claim 1, wherein where the opposite substrate is provided with a protection layer, the first sub-barrier layer is located in a same layer and made of a same material as the protection layer.

4. The display device of claim 1, wherein where the array substrate comprises a passivation layer, the second sub-barrier layer is located in a same layer and made of a same material as the passivation layer.

5. The display device of claim 1, wherein an interlocking structure is provided between the first sub-barrier layer and the second sub-barrier layer.

6. The display device of claim 1, wherein the barrier layer has a width ranging from 0.1 μm to 200 μm.

7. The display device of claim 1, wherein a height of the barrier layer is 1~1.2 times as large as a cell gap of the display device.

8. The display device of claim 1, wherein the first sub-barrier layer is disposed between the opposite substrate and the second sub-barrier layer.

9. A manufacturing method of a display device, comprising:
manufacturing an array substrate and an opposite substrate respectively, wherein the array substrate or the opposite substrate is provided with a pre-cutting position;
forming a barrier layer at a position corresponding to the pre-cutting position;
forming sealant frames on a surface of the array substrate or the opposite substrate, wherein the barrier layer is provided between two adjacent the sealant frames, and a material forming the barrier layer has an elongation at fracture smaller than that of a material of the sealant frames; and
assembling the opposite substrate and the array substrate to form a cell;
wherein the barrier layer comprises a first sub-barrier layer and a second sub-barrier layer, the first sub-barrier layer is formed on the opposite substrate and at a position corresponding to the pre-cutting position, and the second sub-barrier layer is formed on the array substrate and at a position corresponding to the pre-cutting position.

10. The manufacturing method of a display device of claim 9, wherein where a spacer is provided,
the first sub-barrier layer, which is located in a same layer and made of a same material as the spacer, is formed by one patterning process.

11. The manufacturing method of a display device of claim 9, wherein where the opposite substrate is provided with a protection layer,
the first sub-barrier layer, which is located in a same layer and made of a same material as the protection layer, is formed by one patterning process on the opposite substrate.

12. The manufacturing method of a display device of claim 9, wherein where the array substrate comprises a passivation layer,
the second sub-barrier layer, which is located in a same layer and made of a same material as the passivation layer, is formed by one patterning process on the array substrate.

13. The manufacturing method of a display device of claim 9, wherein the barrier layer has a width ranging from 0.1 μm to 200 μm.

14. The manufacturing method of a display device of claim 9, wherein a height of the barrier layer is 1~1.2 times as large as a cell gap of the display device.

15. The manufacturing method of a display device of claim 9, wherein the barrier layer is made of a resin material.

16. A display device, comprising:
- an array substrate;
- an opposite substrate;
- sealant frames between the array substrate and the opposite substrate, wherein a pre-cutting position is disposed between two adjacent the sealant frames; and
- a barrier layer between the array substrate and the opposite substrate and at a position corresponding to the pre-cutting position, wherein a material forming the barrier layer has an elongation at fracture smaller than that of a material forming the sealant frames,
- wherein the barrier layer is disposed on the opposite substrate, and where the opposite substrate is provided with a protection layer, the barrier layer is located in a same layer and made of a same material as the protection layer; or
- the barrier layer is disposed on the array substrate, and where the array substrate comprises a passivation layer, the barrier layer is located in a same layer and made of a same material as the passivation layer.

17. The display device of claim 16, wherein the barrier layer has a width ranging from 0.1 μm to 200 μm.

18. The display device of claim 16, wherein a height of the barrier layer is 1~1.2 times as large as a cell gap of the display device.

* * * * *